United States Patent
Shimizu et al.

(10) Patent No.: US 10,079,285 B2
(45) Date of Patent: Sep. 18, 2018

(54) SEMICONDUCTOR DEVICE, POWER CIRCUIT, COMPUTER, AND METHOD FOR MANUFACTURING SEMICONDUCTOR DEVICE

(71) Applicant: Kabushiki Kaisha Toshiba, Minato-ku (JP)

(72) Inventors: Tatsuo Shimizu, Shinagawa (JP); Hisashi Saito, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/430,739

(22) Filed: Feb. 13, 2017

(65) Prior Publication Data

US 2018/0026107 A1    Jan. 25, 2018

(30) Foreign Application Priority Data

Jul. 22, 2016    (JP) ................... 2016-144516

(51) Int. Cl.
| | | |
|---|---|---|
| *H01L 29/778* | (2006.01) | |
| *H01L 29/40* | (2006.01) | |
| *H01L 29/20* | (2006.01) | |
| *H01L 29/205* | (2006.01) | |
| *H01L 29/66* | (2006.01) | |

(52) U.S. Cl.
CPC ........ *H01L 29/408* (2013.01); *H01L 29/2003* (2013.01); *H01L 29/205* (2013.01); *H01L 29/401* (2013.01); *H01L 29/66462* (2013.01); *H01L 29/7787* (2013.01)

(58) Field of Classification Search
CPC ............ H01L 29/1033; H01L 29/2003; H01L 29/66462; H01L 29/7786; H01L 29/7788
See application file for complete search history.

(56) References Cited

U.S. PATENT DOCUMENTS

| | | | | |
|---|---|---|---|---|
| 4,821,093 | A * | 4/1989 | Iafrate ................ | H01L 29/0657 257/194 |
| 5,904,517 | A * | 5/1999 | Gardner ............ | H01L 21/82346 257/E21.438 |
| 6,162,692 | A * | 12/2000 | Gardner ............ | H01L 21/26586 257/E21.345 |
| 7,038,253 | B2 * | 5/2006 | Yoshida ............ | H01L 29/66462 257/188 |

(Continued)

FOREIGN PATENT DOCUMENTS

JP    2014-17285    1/2014

OTHER PUBLICATIONS

Tajima et al., Effects of Surface Oxidation of AlGaN on DC Characteristics of AlGaN/GaN High-Electron-Mobility Transistors, Japanese Journal of Applied Physics, 48, 020203, 2009, pp. 1-3.*

(Continued)

*Primary Examiner* — Earl Taylor
(74) *Attorney, Agent, or Firm* — Oblon, McClelland, Maier & Neustadt, L.L.P.

(57) ABSTRACT

A semiconductor device according to an embodiment includes a nitride semiconductor layer, an insulating layer provided on the nitride semiconductor layer, a first region provided in the nitride semiconductor layer, and a second region which is provided between the first region and the insulating layer in the nitride semiconductor layer and has a higher electric resistivity than the first region.

21 Claims, 14 Drawing Sheets

(56) References Cited

U.S. PATENT DOCUMENTS

| | | | | |
|---|---|---|---|---|
| 7,291,872 B2* | 11/2007 | Hikita | ............... | H01L 29/41766 257/192 |
| 9,685,546 B2* | 6/2017 | Shimizu | .............. | H01L 29/7786 |
| 9,711,362 B2* | 7/2017 | Shimizu | ............ | H01L 21/28264 |
| 9,748,355 B2* | 8/2017 | Koezuka | ........... | H01L 29/66477 |
| 9,812,562 B1* | 11/2017 | Chang | ................ | H01L 29/7787 |
| 2001/0015437 A1* | 8/2001 | Ishii | ................... | H01L 21/0242 257/12 |
| 2002/0017648 A1* | 2/2002 | Kasahara | ......... | H01L 21/28575 257/79 |
| 2003/0096438 A1* | 5/2003 | Lee | .................. | H01L 27/14643 438/29 |
| 2003/0096442 A1* | 5/2003 | Lee | .................. | H01L 21/31051 438/59 |
| 2005/0087766 A1* | 4/2005 | Kikkawa | .......... | H01L 21/02378 257/194 |
| 2005/0153528 A1* | 7/2005 | Oyu | ................. | H01L 21/26506 438/516 |
| 2005/0164448 A1* | 7/2005 | Okonogi | ............ | H01L 21/2652 438/253 |
| 2007/0228416 A1* | 10/2007 | Chen | .................. | H01L 21/8252 257/192 |
| 2007/0278518 A1* | 12/2007 | Chen | ................ | H01L 29/66462 257/192 |
| 2008/0067636 A1* | 3/2008 | Shimizu | ........... | H01L 21/28185 257/651 |
| 2009/0209079 A1* | 8/2009 | Oyu | ................. | H01L 21/26506 438/306 |
| 2009/0230513 A1* | 9/2009 | Yoo | ........................ | C30B 31/20 257/609 |
| 2011/0057233 A1* | 3/2011 | Park | ................... | H01L 29/1033 257/194 |
| 2013/0032818 A1* | 2/2013 | Nishimori | ......... | H01L 29/42316 257/76 |
| 2013/0200389 A1* | 8/2013 | Lee | ....................... | H01L 29/205 257/76 |
| 2013/0307024 A1* | 11/2013 | Kokawa | .............. | H01L 29/1075 257/190 |
| 2014/0008661 A1* | 1/2014 | Iwami | ................. | H01L 29/2003 257/76 |
| 2014/0030845 A1* | 1/2014 | Koezuka | ........... | H01L 29/66477 438/104 |
| 2014/0034958 A1* | 2/2014 | Lim | ........................ | H01L 33/14 257/76 |
| 2014/0159117 A1* | 6/2014 | Taniguchi | ........... | H01L 29/4232 257/194 |
| 2015/0041825 A1* | 2/2015 | Liu | ................... | H01L 29/66462 257/77 |
| 2016/0087045 A1* | 3/2016 | Shimizu | ................ | H01L 21/049 257/77 |
| 2016/0284828 A1* | 9/2016 | Shimizu | .............. | H01L 29/7786 |
| 2016/0284830 A1* | 9/2016 | Shimizu | ................ | H01L 29/408 |
| 2016/0365479 A1* | 12/2016 | Takeuchi | ................ | H01L 33/04 |

OTHER PUBLICATIONS

Yamada et al., Comprehensive study on initial thermal oxidation of GaN(0001) surface and subsequent oxide growth in dry oxygen ambient, Journal Applied Physics, 121, 035303, 2017, pp. 1-9.*

Tran et al., Structural Order in Oxygenated Gallium Nitride Films, J. Phys. Chem. B, 107, 2003, pp. 9256-9260.*

Laaksonen, et al., Vacancies in wurtzite GaN and AlN, J. Phys.: Condens. Matter, 21, 015803, 2009, pp. 1-6.*

Yoshiki Sakaida, et al., "Improved current collapse in AlGaN/GaN HEMTs by $O_2$ plasma treatment", CS Mantech Conference, 2014, 4 pgs.

U.S. Appl. No. 14/813,619, filed Jul. 30, 2015, 2016/0087045 A1, Tatsuo Shimizu.

* cited by examiner

SEMICONDUCTOR DEVICE, POWER CIRCUIT, COMPUTER, AND METHOD FOR MANUFACTURING SEMICONDUCTOR DEVICE

CROSS-REFERENCE TO RELATED APPLICATION

This application is based upon and claims the benefit of priority from Japanese Patent Application No. 2016-144516, filed on Jul. 22, 2016, the entire contents of which are incorporated herein by reference.

FIELD

Embodiments described herein relate generally to a semiconductor device, a power circuit, a computer, and a method for manufacturing a semiconductor device.

BACKGROUND

A semiconductor device, such as a switching device or a diode, is used in a circuit such as a switching power supply or an inverter. The semiconductor device requires a high breakdown voltage and low on-resistance. The relationship between the breakdown voltage and the on-resistance is a trade-off relationship which is determined by semiconductor material used for the semiconductor device.

With the progress of technical development, the on-resistance of semiconductor device is reduced to the limit of silicon which is a major semiconductor material. It is necessary to change the semiconductor material in order to further improve the breakdown voltage or to further reduce the on-resistance.

A GaN-based semiconductor, such as gallium nitride (GaN) or aluminum gallium nitride (AlGaN), has a wider bandgap than silicon. When the GaN-based semiconductor is used for switching device, it is possible to improve the trade-off relationship determined by the semiconductor material and to significantly increase the breakdown voltage or to significantly reduce the on-resistance.

However, for example, a switching device using the GaN-based semiconductor has the problem of "current collapse" in which, when a high drain voltage is applied, on-resistance increases.

DETAILED DESCRIPTION

Figure 1:
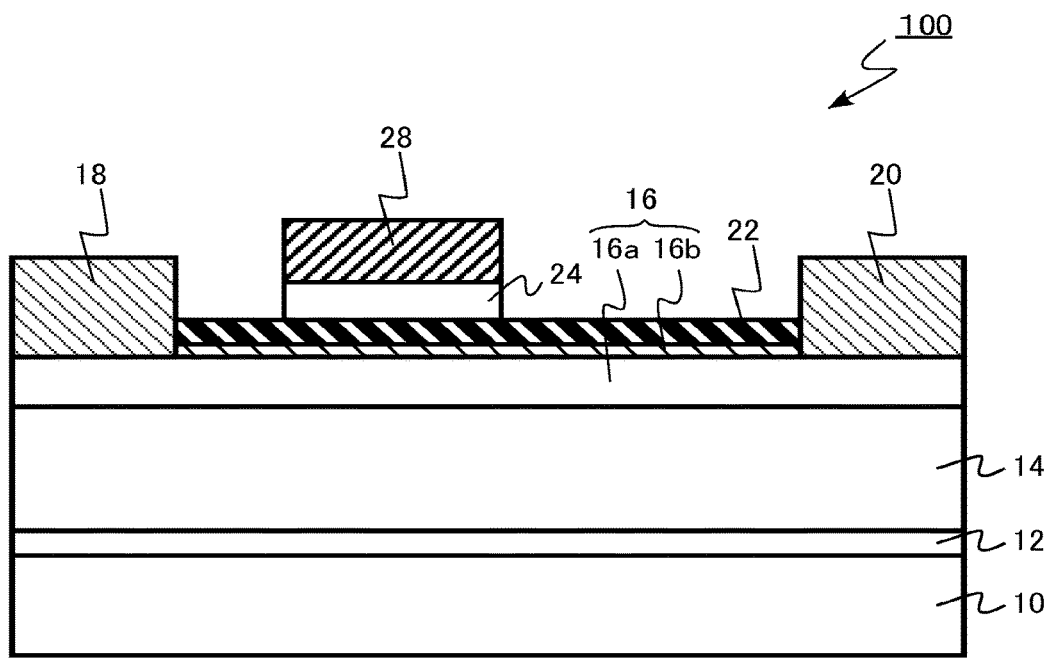
FIG. 1 is a cross-sectional view schematically illustrating a semiconductor device according to a first embodiment.

A semiconductor device according to an aspect of the invention includes an insulating layer provided on the nitride semiconductor layer, a first region provided in the nitride semiconductor layer, and a second region provided between the first region and the insulating layer in the nitride semiconductor layer, the second region having a higher electric resistivity than the first region.

In the specification, the same or similar members are denoted by the same reference numerals and the description thereof will not be repeated.

In the specification, a "GaN-based semiconductor" is a general term of a semiconductor including gallium nitride (GaN), aluminum nitride (AlN), indium nitride (InN), and an intermediate composition thereof.

In the specification, the upward direction in the drawings is represented by an "upper side" and the downward direction in the drawings is represented by a "lower side", in order to indicate the positional relationship between components. In the specification, the concept of the "upper side" and the "lower side" does not necessarily indicate the positional relationship with the direction of gravity.

First Embodiment

A semiconductor device according to this embodiment includes a nitride semiconductor layer, an insulating layer provided on the nitride semiconductor layer, a first region provided in the nitride semiconductor layer, and a second region which is provided between the first region and the insulating layer in the nitride semiconductor layer and has a higher electric resistivity than the first region.

In addition, a semiconductor device according to this embodiment includes a nitride semiconductor layer, an insulating layer provided on the nitride semiconductor layer, and a region that is provided in a portion of the nitride semiconductor layer which is close to the insulating layer and has two oxygen atoms present at a lattice position of a nitrogen atom.

Since the semiconductor device according to this embodiment has the above-mentioned structure, it is possible to reduce the level which is present in the vicinity of the interface between the nitride semiconductor layer and the insulating layer and is an electron trap. Therefore, it is possible to prevent current collapse caused by the electron trap.

Hereinafter, an example in which, when atoms other than nitrogen atoms forming the crystal structure of the nitride semiconductor layer are atoms X, the atoms X are gallium (Ga) atoms or the atoms X are gallium (Ga) atoms and aluminum (Al) atoms will be described. That is, an example in which the nitride semiconductor layer is made of gallium nitride or aluminum gallium nitride will be described.

FIG. 1 is a cross-sectional view schematically illustrating the semiconductor device according to this embodiment. The semiconductor device according to this embodiment is a high electron mobility transistor (HEMT) using a GaN-based semiconductor.

As illustrated in FIG. 1, an HEMT (semiconductor device) 100 includes a substrate 10, a buffer layer 12, a channel layer (first semiconductor region) 14, a barrier layer (second semiconductor region) 16, a source electrode (first electrode) 18, a drain electrode (second electrode) 20, an insulating layer 22, a p-type layer 24, and a gate electrode 28.

The channel layer (first semiconductor region) 14 and the barrier layer (second semiconductor region) 16 are nitride semiconductor layers. The barrier layer 16 includes a low-resistance region (first region) 16a and a high-resistance region (second region) 16b.

The substrate 10 is made of, for example, silicon (Si). In addition to silicon, for example, sapphire ($Al_2O_3$) or silicon carbide (SiC) may be applied to the substrate 10.

The buffer layer 12 is provided on the substrate 10. The buffer layer 12 has a function of reducing the lattice mismatch between the substrate 10 and the channel layer 14. The buffer layer 12 has a multi-layer structure of, for example, aluminum gallium nitride ($Al_WGa_{1-W}N$ (0<W<1)).

The channel layer 14 is provided on the buffer layer 12. The channel layer 14 is also referred to as an electron transit layer. The channel layer 14 is made of, for example, $Al_XGa_{1-X}N$ (0≤X<1). Specifically, the channel layer 14 is made of, for example, GaN. The thickness of the channel layer 14 is, for example, equal to or greater than 0.1 μm and equal to or less than 10 μm.

The barrier layer 16 is provided on the channel layer 14. The barrier layer 16 is also referred to as an electron supply layer. The bandgap of the barrier layer 16 is greater than the bandgap of the channel layer 14. The barrier layer 16 is made of, for example, $Al_YGa_{1-Y}N$ (0<Y≤1, X<Y). Specifically, the barrier layer 16 is made of, for example, $Al_{0.25}Ga_{0.75}N$. The thickness of the barrier layer 16 is, for example, equal to or greater than 10 nm and equal to or less than 100 nm.

The interface between the channel layer 14 and the barrier layer 16 is a hetero-junction interface. A two-dimensional electron gas (2DEG) is formed at the hetero-junction interface of the HEMT 100 and becomes a carrier.

The barrier layer 16 includes the low-resistance region 16a and the high-resistance region 16b. The high-resistance region 16b is provided in a portion of the barrier layer 16 which is close to the insulating layer 22.

The electric resistivity of the high-resistance region 16b is higher than the electric resistivity of the low-resistance region 16a. The magnitude relationship between the electric resistivities can be determined by, for example, spreading resistance analysis (SRA) or scanning spreading resistance microscopy (SSRM).

The electric resistivity of the low-resistance region 16a is reduced since carrier concentration is higher than that of the high-resistance region 16b. Therefore, the magnitude relationship between the electric resistivities can be determined by, for example, scanning capacitance microscopy (SCM) that can determine the magnitude of carrier concentration.

For example, there is a nitrogen defect (hereinafter, also referred to as VN) in aluminum gallium nitride in the low-resistance region 16a. The nitrogen defect functions as a donor. Therefore, the nitrogen defect causes aluminum gallium nitride to change to an n type. As a result, the electric resistivity of the low-resistance region 16a is reduced.

The high-resistance region 16b includes two oxygen atoms (hereinafter, also referred to as VNOO) located at the lattice position of a nitrogen atom. For example, two oxygen atoms enter the lattice position of a nitrogen atom in aluminum gallium nitride. The two oxygen atoms which have entered the lattice position of the nitrogen atom function as an acceptor.

In the high-resistance region 16b, carrier concentration is lower than that of the low-resistance region 16a due to the interaction between VN as a donor and VNOO as an acceptor. Therefore, the electric resistivity of the high-resistance region 16b is higher than that of the low-resistance region 16a.

In the high-resistance region 16b, VN and VNOO are adjacent to each other. In the high-resistance region 16b, VN and VNOO are so close that they electrically interact with each other.

It is assumed that atoms other than nitrogen atoms forming the barrier layer 16 are atoms X. In this case, in the HEMT 100, the high-resistance region 16b includes the atom X that has a bond to an oxygen atom and a dangling bond. The oxygen atom which is bonded to the atom X is one of the two oxygen atoms forming VNOO. Since the atom X has a bond to the oxygen atom and a dangling bond, a structure in which VNOO and VN are closest to each other is achieved. In other words, VNOO, the atom X, and VN form a complex.

The bond between the atom X and the oxygen atom, the dangling bond of the atom X, and a complex of VNOO, the atom X, and VN in the high-resistance region 16b can be measured by, for example, X-ray photoelectron spectroscopy (XPS), infrared spectroscopy, or Raman spectroscopy.

The oxygen concentration of the high-resistance region 16b is, for example, equal to or greater than $1 \times 10^{19}$ $cm^{-3}$. The oxygen concentration of the high-resistance region 16b can be measured by, for example, secondary ion mass spectroscopy (SIMS).

For example, when the atom X is a gallium (Ga) atom, one gallium atom is bonded to one of the oxygen atoms forming VNOO and has a dangling bond. When the atom X is an aluminum (Al) atom, one aluminum atom is bonded to one of the oxygen atoms forming VNOO and has a dangling bond.

The thickness of the high-resistance region 16b is, for example, equal to or greater than 0.5 nm and equal to or less than 10 nm.

The insulating layer 22 is provided on the high-resistance region 16b. The insulating layer 22 functions as a gate insulating layer of the HEMT 100.

The insulating layer 22 is made of, for example, silicon oxide. The insulating layer 22 may be made of, for example, silicon nitride or silicon oxynitride. In addition, the insulating layer 22 may be, for example, a stacked structure of materials selected from silicon oxide, silicon nitride, and silicon oxynitride.

The thickness of the insulating layer 22 is, for example, equal to or greater than 10 nm and equal to or less than 100 nm.

The source electrode 18 and the drain electrode 20 are formed on the barrier layer 16. The source electrode 18 and the drain electrode 20 come into contact with the low-resistance region 16a.

The source electrode 18 and the drain electrode 20 are, for example, metal electrodes. The metal electrode is, for example, a stacked structure of titanium (Ti) and aluminum (Al).

It is preferable that the source electrode 18 and the drain electrode 20 come into ohmic contact with the barrier layer 16. The distance between the source electrode 18 and the drain electrode 20 is, for example, equal to or greater than 5 μm and equal to or less than 30 μm.

The p-type layer 24 is provided on the insulating layer 22 between the source electrode 18 and the drain electrode 20. The p-type layer 24 has a function of increasing the threshold voltage of the HEMT 100. Since the p-type layer 24 is provided, the HEMT 100 can operate as a normally-off transistor.

The p-type layer 24 is made of, for example, p-type gallium nitride (GaN) to which magnesium (Mg) is applied as p-type impurities. The p-type layer 24 is, for example, polycrystalline.

The gate electrode 28 is provided on the p-type layer 24. The gate electrode 28 is, for example, a metal electrode. The gate electrode 28 is made of, for example, titanium nitride (TiN).

Next, an example of a method for manufacturing the semiconductor device according to this embodiment will be described. FIGS. 2 to 5 are cross-sectional views schematically illustrating the semiconductor device according to this embodiment which is being manufactured.

The method for manufacturing the semiconductor device according to this embodiment includes forming a first insulating layer on a nitride semiconductor layer; and performing a heat treatment in an atmosphere including oxygen under the condition that the amount of oxidation of the nitride semiconductor layer is equal to or less than 1 nm to forma region including oxygen in the nitride semiconductor layer.

First, the substrate 10, for example, a Si substrate is prepared. Then, for example, the buffer layer 12 is grown on the Si substrate by epitaxial growth.

The buffer layer 12 is, for example, a multi-layer structure of aluminum gallium nitride ($Al_WGa_{1-W}N$ (0<W<1)). For example, the buffer layer 12 is grown by a metal organic chemical vapor deposition (MOCVD) method.

Figure 2:
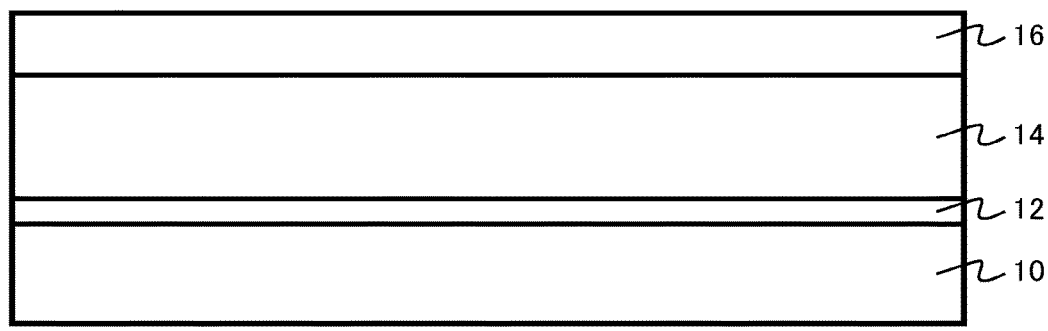
FIG. 2 is a cross-sectional view schematically illustrating the semiconductor device according to the first embodiment which is being manufactured.

Then, gallium nitride which will be the channel layer 14 and aluminum gallium nitride which will be the barrier layer 16 are formed on the buffer layer 12 by epitaxial growth (FIG. 2). The aluminum gallium nitride has, for example, a composition of $Al_{0.25}Ga_{0.75}N$. For example, the channel layer 14 and the barrier layer 16 are grown by the MOCVD method.

Figure 3:
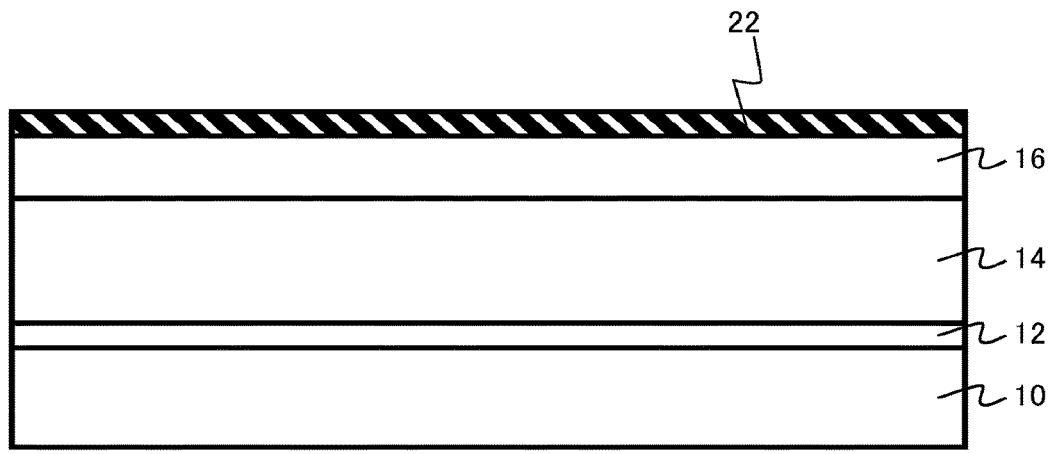
FIG. 3 is a cross-sectional view schematically illustrating the semiconductor device according to the first embodiment which is being manufactured.

Then, the insulating layer (first insulating layer) 22 is formed on the barrier layer 16 (FIG. 3). The insulating layer 22 is, for example, a silicon oxide layer which is formed by a chemical vapor deposition (CVD) method.

Then, a heat treatment is performed in an atmosphere including oxygen under the condition that the amount of oxidation of the barrier layer 16 is equal to or less than 1 nm. For example, oxygen is included as oxygen molecules in the atmosphere. Before and after the heat treatment, the thickness of the insulating layer 22 can be measured to determine whether the amount of oxidation of the barrier layer 16 is equal to or less than 1 nm.

The atmosphere of the heat treatment is, for example, a dry oxygen atmosphere. The heat treatment is performed at a temperature that is, for example, equal to or greater than 400° C. and equal to or less than 1050° C.

Figure 4:
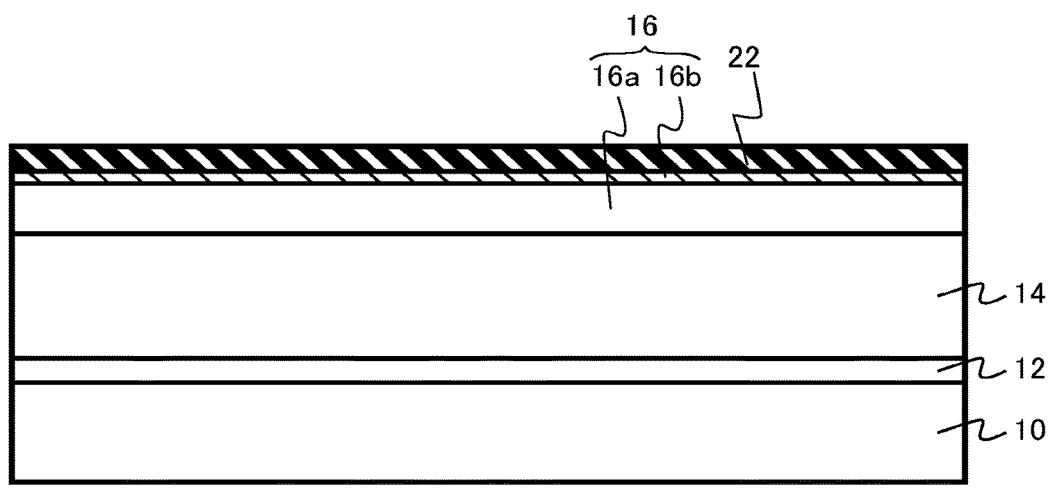
FIG. 4 is a cross-sectional view schematically illustrating the semiconductor device according to the first embodiment which is being manufactured.

The high-resistance region 16b is formed in a portion of the barrier layer 16 which is close to the insulating layer 22 by the heat treatment (FIG. 4). A portion of the barrier layer 16 below the high-resistance region 16b becomes the low-resistance region 16a having a lower electric resistivity than the high-resistance region 16b.

Two oxygen atoms are introduced to the lattice position of a nitrogen atom in the barrier layer 16 to form the high-resistance region 16b. For example, two oxygen atoms are introduced to a nitrogen defect (VN) of the barrier layer 16.

Figure 5:
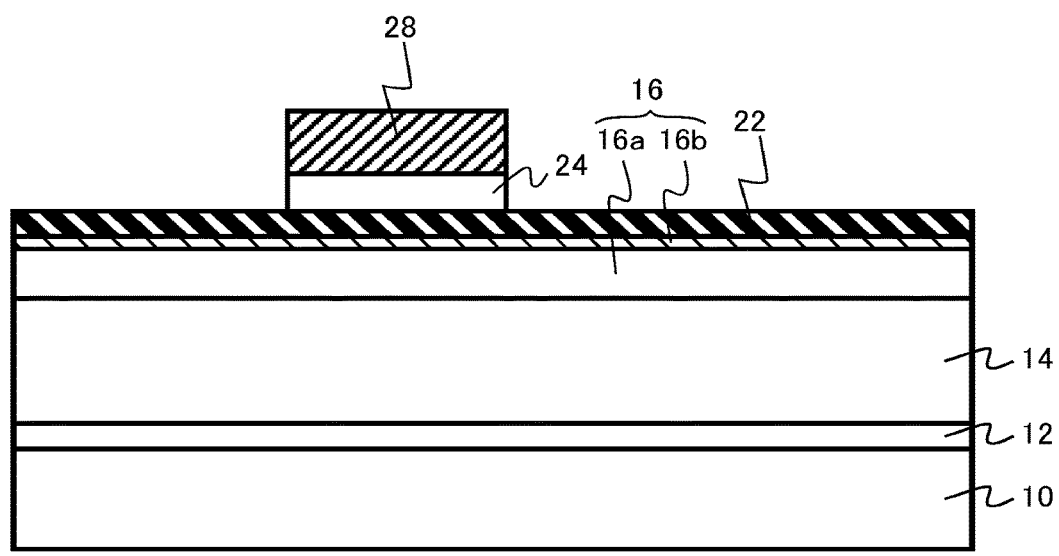
FIG. 5 is a cross-sectional view schematically illustrating the semiconductor device according to the first embodiment which is being manufactured.

Then, the p-type layer 24 and the gate electrode 28 are formed on the insulating layer 22 (FIG. 5).

Then, the source electrode 18 and the drain electrode 20 are formed on the barrier layer 16. When the source electrode 18 and the drain electrode 20 are formed, the high-resistance region 16b is removed by etching.

The source electrode 18 and the drain electrode 20 are formed so as to come into contact with the low-resistance region 16a. The source electrode 18 and the drain electrode 20 are formed such that the gate electrode 28 is interposed therebetween.

The HEMT 100 illustrated in FIG. 1 is formed by the above-mentioned manufacturing method.

Next, the function and effect of the semiconductor device and the semiconductor device manufacturing method according to this embodiment will be described. FIGS. 6A, 6B, 7A, 7B, 8A, and 8B are diagrams illustrating the function of the semiconductor device and the semiconductor device manufacturing method according to this embodiment.

Hereinafter, an example in which gallium nitride is used as the nitride semiconductor will be described.

Figure 6A:
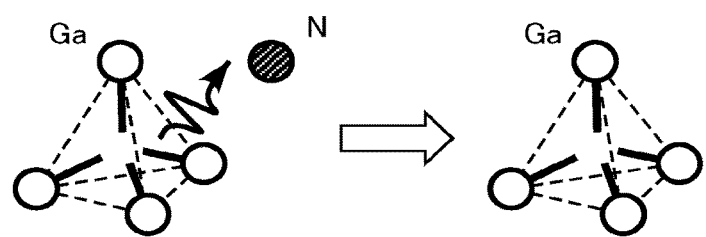
FIGS. 6A and 6B are diagrams illustrating the function and effect of the semiconductor device and a semiconductor device manufacturing method according to the first embodiment.
Figure 6B:
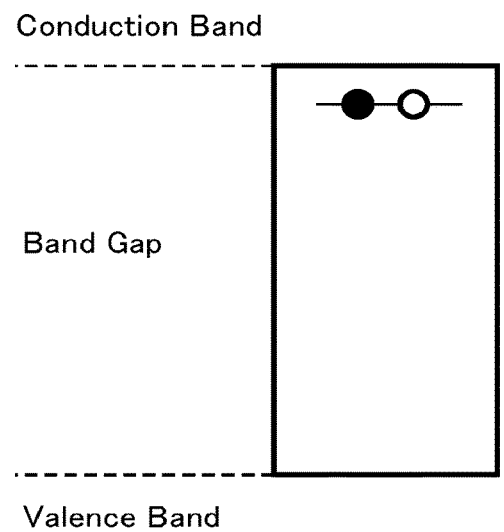

FIGS. 6A and 6B are diagrams illustrating a nitrogen defect (VN). FIG. 6A is a diagram schematically illustrating VN in gallium nitride. FIG. 6B is a diagram illustrating the level formed by VN which is calculated by first principle calculation.

As illustrated in FIG. 6A, VN in gallium nitride is formed by the separation of a nitrogen atom from the gallium nitride. A gallium atom adjacent to VN has a dangling bond. VN functions as a donor in the gallium nitride.

The first principle calculation proves that VN forms a level in the bandgap of gallium nitride, as illustrated in FIG. 6B. In FIG. 6B, a black circle indicates a state in which the level is filled with electrons and a white circle indicates a state in which the level is not filled with electrons.

In the HEMT, it is considered that one of the causes of current collapse is a change in the density of 2DEG caused by the trapping of electrons at the level of the bandgap. In general, VN is present in gallium nitride. It is considered that the density of VN is particularly high in the vicinity of the interface between the barrier layer 16 and the insulating layer 22. In addition, the dangling bond of a gallium atom is present at the interface between the barrier layer 16 and the insulating layer 22.

For example, when an electron is trapped at the level formed by VN, VN is negatively charged. Therefore, for example, the density of 2DEG immediately below VN is reduced. As a result, current collapse occurs.

When an electron is trapped in VN immediately below the gate electrode 28, the threshold voltage of the HEMT 100 varies.

The dangling bond of the gallium atom that is present at the interface between the barrier layer 16 and the insulating layer 22 forms the same level as VN. Therefore, the function generated by the dangling bond of the gallium atom that is present at the interface between the barrier layer 16 and the insulating layer 22 is the same as that generated by VN.

Figure 7A:
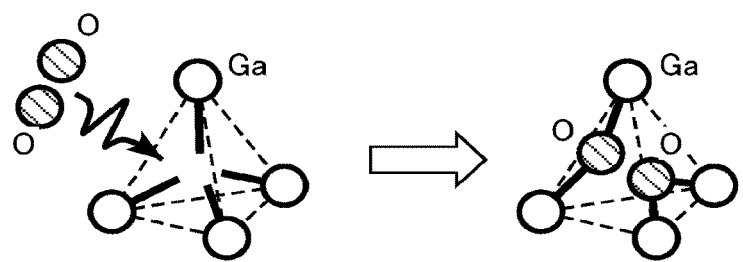
FIGS. 7A and 7B are diagrams illustrating the function and effect of the semiconductor device and the semiconductor device manufacturing method according to the first embodiment.
Figure 7B:
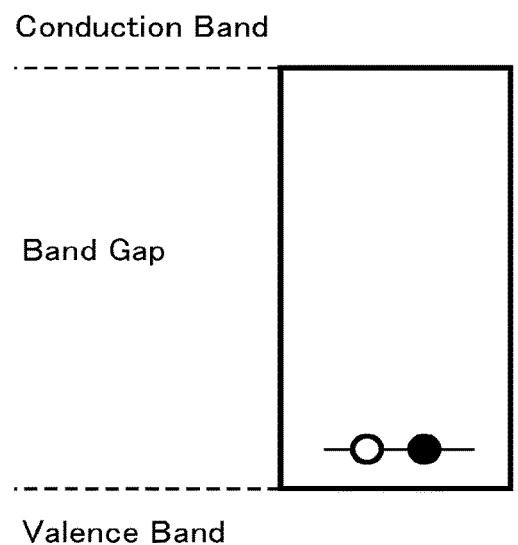

FIGS. 7A and 7B are diagrams illustrating two oxygen atoms (VNOO) that are present at the lattice position of a nitrogen atom. FIG. 7A is a diagram schematically illustrating VNOO in gallium nitride. FIG. 7B is a diagram illustrating the level formed by VNOO which is calculated by the first principle calculation.

As illustrated in FIG. 7A, two oxygen atoms are introduced to VN in gallium nitride to form VNOO in the gallium nitride. Each of the two oxygen atoms is bonded to two gallium atoms that are adjacent to the oxygen atom. VNOO functions as an acceptor in the gallium nitride.

The first principle calculation proves that VNOO forms a level in the bandgap of gallium nitride as illustrated in FIG. 7B. In FIG. 7B, a black circle indicates a state in which the level is filled with electrons and a white circle indicates a state in which the level is not filled with electrons.

Figure 8A:
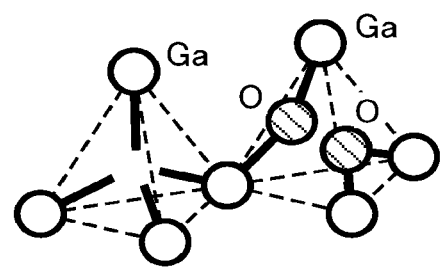
FIGS. 8A and 8B are diagrams illustrating the function and effect of the semiconductor device and the semiconductor device manufacturing method according to the first embodiment.
Figure 8B:
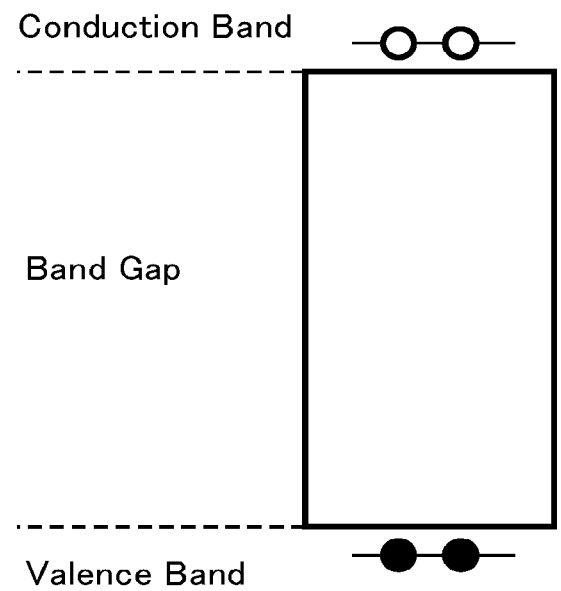

FIGS. 8A and 8B are diagrams illustrating a case in which VN and VNOO coexist. FIG. 8A is a diagram schematically illustrating VN and VNOO in gallium nitride. FIG. 8B is a diagram illustrating a level when VN and VNOO which are calculated by the first principle calculation coexist.

FIG. 8A illustrates a state in which VN and VNOO are closest to each other when VN and VNOO coexist in gallium nitride. In other words, one gallium atom has a dangling bond and is bonded to one of the oxygen atoms forming VNOO.

The first principle calculation proves that, when VN and VNOO coexist, a structure in which electrons are moved from the level of VN to the level of VNOO is stabilized as illustrated in FIG. 8B. At that time, the level formed by VN moves to a conduction band and the level formed by VNOO moves to a valence band. Therefore, the level in the bandgap of gallium nitride is removed.

In this embodiment, VNOO is provided in gallium nitride. The level in the bandgap of gallium nitride is removed by the interaction between VNOO and VN and the interaction between VNOO and a dangling bond at the interface between the barrier layer 16 and the insulating layer 22. Therefore, electron trap is prevented. As a result, it is possible to prevent current collapse.

When VN and VNOO coexist, a donor level and an acceptor level are removed. Therefore, carriers are cancelled and carrier concentration is reduced. As a result, the electric resistivity of gallium nitride increases.

It is considered that the amount of VN in gallium nitride is equal to or greater than about $1 \times 10^{18}$ cm$^{-3}$ and equal to or less than $1 \times 10^{20}$ cm$^{-3}$. When there is surplus VN that does not form a complex with VNOO, there is a concern that current collapse and a variation in the threshold voltage will occur due to the level of the remaining VN in the bandgap.

The oxygen concentration of the high-resistance region 16$b$ is preferably equal to or greater than $2 \times 10^{19}$ cm$^{-3}$ and more preferably equal to or greater than $2 \times 10^{20}$ cm$^{-3}$, in order to prevent the generation of surplus VN.

Since electron trap immediately below the gate electrode 28 is prevented, a variation in the threshold voltage is prevented.

FIGS. 9A, 9B, 9C, and 9D are diagrams illustrating the function of the semiconductor device manufacturing method according to this embodiment.

Figure 9A:
FIGS. 9A, 9B, 9C, and 9D are diagrams illustrating the function of the semiconductor device manufacturing method according to the first embodiment.
Figure 9B:
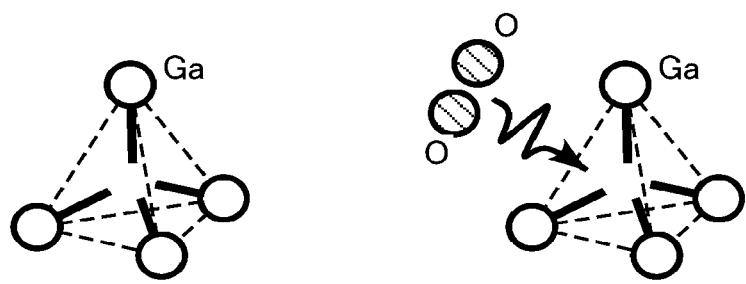

It is assumed that VN illustrated in FIG. 9A is present in gallium nitride. As illustrated in FIG. 9B, a heat treatment is performed in an oxygen atmosphere to supply two oxygen molecules to the gallium nitride.

Figure 9C:
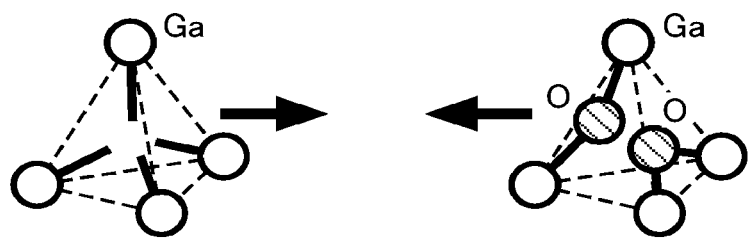

As illustrated in FIG. 9C, the oxygen molecules are introduced to VN to form VNOO. In other words, two oxygen atoms are introduced to the lattice position of a nitrogen atom in the gallium nitride. Each of the two oxygen atoms is bonded to two gallium atoms.

Figure 9D:
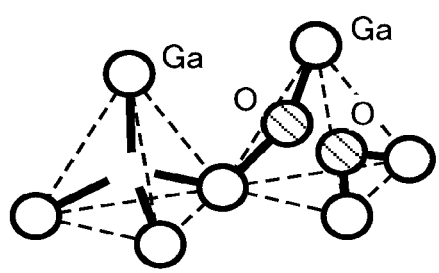

According to the first principle calculation, VNOO and VN are closed to each other and the energy of the system is reduced. As a result, a stable structure is formed. Therefore, as illustrated in FIG. 9D, a structure in which VNOO and VN are closed to each other is formed by the heat treatment. Specifically, for example, a structure in which one gallium atom has a dangling bond and is bonded to one of the oxygen atoms forming VNOO is formed.

An example in which the atoms X which are atoms other than the nitrogen atoms forming the nitride semiconductor layer are gallium atoms has been described above with reference to FIGS. 6A, 6B, 7A, 7B, 8A, 8B, 9A, 9B, 9C, and 9D. That is, an example in which the nitride semiconductor layer is made of gallium nitride has been described. However, other GaN-based semiconductors in which some or all of the gallium atoms in gallium nitride are substituted with aluminum or indium atoms may have the same function as the gallium nitride. That is, even when the atoms X are aluminum or indium atoms, the same function as that when the atoms X are gallium atoms is obtained.

In this embodiment, it is preferable that a heat treatment for forming VNOO be performed in an oxygen atmosphere under the condition that aluminum gallium nitride is not substantially oxidized. Specifically, after the insulating layer 22 is formed on the barrier layer 16, the heat treatment is performed in an atmosphere including oxygen under the condition that the amount of oxidation of the barrier layer 16 is equal to or less than 1 nm.

After the insulating layer 22 is formed on the barrier layer 16, the heat treatment is performed such that aluminum gallium nitride is not oxidized by the heat treatment. The reason is that, when the barrier layer 16 is directly exposed to the oxygen atmosphere, the surface of the barrier layer 16 is oxidized.

It is preferable that oxygen molecules be included in the heat treatment atmosphere. In this case, oxygen is supplied as oxygen molecules, each of which is a pair of two oxygen atoms, to the barrier layer 16, which makes it easy to form a VNOO structure.

For example, when oxygen in a plasma state is supplied to the barrier layer 16, a single oxygen atom is supplied.

Therefore, it is difficult to introduce two oxygen atoms to the lattice position of the same nitrogen atom.

A structure (hereinafter, also referred to as VNO) in which one oxygen atom is present at the lattice position of a nitrogen atom functions as a donor in nitride semiconductor. Therefore, even when VNO and VN coexist, donors coexist and the electric resistivity of nitride semiconductor does not increase. In addition, a reduction in level in the bandgap due to the interaction between VNO and VN does not occur.

It is preferable that the temperature of the heat treatment be equal to or greater than 400° C. and equal to or less than 1050° C. When the temperature is higher than the above-mentioned range, there is a concern that aluminum gallium nitride in the barrier layer 16 will be oxidized even when the insulating layer 22 is provided on the barrier layer 16. When the temperature is higher than the above-mentioned range, an oxygen molecule is separated into oxygen atoms and is then supplied to the barrier layer 16. As a result, it is difficult to form VNOO. When aluminum gallium nitride is oxidized or an oxygen molecule is separated into oxygen atoms and is then supplied to the barrier layer 16, VNO is likely to be formed, instead of VNOO.

When the temperature of the heat treatment is lower than the above-mentioned range, there is a concern that oxygen will not be diffused to the insulating layer 22. The temperature of the heat treatment is preferably equal to or greater than 550° C. and equal to or less than 900° C.

After the heat treatment is performed in the oxygen atmosphere, a treatment including oxygen plasma at a low temperature of 100° C. or less, for example, an ozone ($O_3$) treatment at room temperature (20° C.) is performed to form a stable VNOO structure. The reason is that, when a VNO structure remains, it is possible to form the VNOO structure. Then, some nitrogen atoms are emitted and a VN structure required to increase resistance is generated. Therefore, it is preferable to perform the ozone treatment at a low temperature after the heat treatment is performed in the oxygen atmosphere.

Figure 10A:
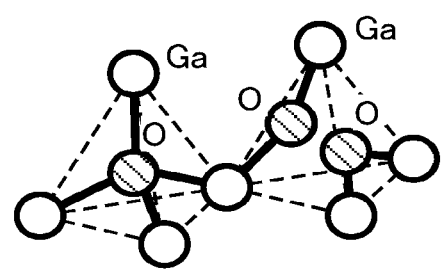
FIGS. 10A and 10S are diagrams illustrating the function of the semiconductor device manufacturing method according to the first embodiment.
Figure 10B:
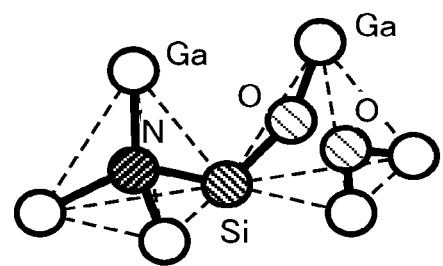

FIGS. 10A and 10B are diagrams illustrating a modification example of this embodiment. FIG. 10A is a diagram schematically illustrating a case in which VNOO and VNO coexist and FIG. 10B is a diagram schematically illustrating a case in which VNOO and a structure in which a silicon atom is present at the position of gallium in gallium nitride coexist.

VNO functions as a donor in nitride semiconductor. According to the first principle calculation, even when VNOO and VNO coexist as illustrated in FIG. 10A, the level in the bandgap is removed by the interaction therebetween, similarly to a case in which VNOO and VN coexist.

In addition, in a structure in which one atom selected from a bivalent sulfur (S) atom, a selenium (Se) atom, and a tellurium (Te) atom is present at the lattice position of a nitrogen atom, similarly to the oxygen atom, the atom coexists with VNOO and the same function and effect as those when VN and VNOO coexist are obtained.

A structure in which a silicon atom is present at the position of a gallium atom in gallium nitride functions as a donor in nitride semiconductor. According to the first principle calculation, even when VNOO and the structure in which a silicon atom is present at the position of a gallium atom in gallium nitride coexist as illustrated in FIG. 10B, the level in the bandgap is removed by the interaction therebetween, similarly to a case in which VNOO and VN coexist.

In a structure in which one atom selected from a germanium (Ge) atom, a titanium (Ti) atom, a zirconium (Zr) atom, a hafnium (Hf) atom, and an iron (Fe) atom is present at the position of a gallium atom in gallium nitride, similarly to the silicon atom, the atom coexists with VNOO and the same function and effect as those when VN and VNOO coexist are obtained.

For example, a sulfur (S) atom, a selenium (Se) atom, a tellurium (Te) atom, a silicon (Si) atom, a germanium (Ge) atom, a titanium (Ti) atom, a zirconium (Zr) atom, a hafnium (Hf) atom, and an iron (Fe) atom can be introduced into the barrier layer 16 by ion implantation or solid-phase diffusion from a deposited film.

According to the semiconductor device and the semiconductor device manufacturing method of this embodiment, the level in the bandgap is reduced to prevent current collapse. In addition, the level in the bandgap is reduced to prevent a variation in the threshold voltage. Therefore, it is possible to achieve a semiconductor device with high reliability.

Second Embodiment

A semiconductor device manufacturing method according to this embodiment is the same as the semiconductor device manufacturing method according to the first embodiment except that, after a heat treatment is performed, the first insulating layer is removed and a second insulating layer is formed on the nitride semiconductor layer. Therefore, the description of the same content as that in the first embodiment will not be repeated.

FIGS. 11 to 14 are cross-sectional views schematically illustrating the semiconductor device according to this embodiment which is being manufactured.

First, the buffer layer 12, the channel layer 14, and the barrier layer 16 are grown on the substrate 10 by the same process as that in the first embodiment.

Figure 11:
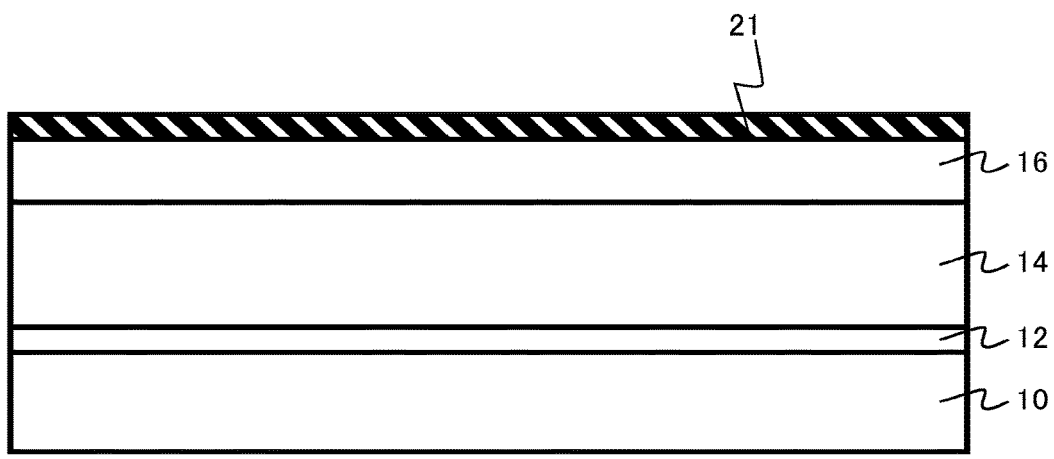
FIG. 11 is a cross-sectional view schematically illustrating a semiconductor device according to a second embodiment which is being manufactured.

An insulating layer (first insulating layer) 21 is formed on the barrier layer 16 (FIG. 11). The insulating layer 21 is, for example, a silicon oxide layer formed by a CVD.

Then, a heat treatment is performed in an atmosphere including oxygen under the condition that the amount of oxidation of the barrier layer 16 is equal to or less than 1 nm. Before and after the heat treatment, the thickness of the insulating layer 21 can be measured to determine whether the amount of oxidation of the barrier layer 16 is equal to or less than 1 nm.

The atmosphere of the heat treatment is, for example, a dry oxygen atmosphere. The heat treatment is performed at a temperature that is, for example, equal to or greater than 400° C. and equal to or less than 1050° C.

Figure 12:
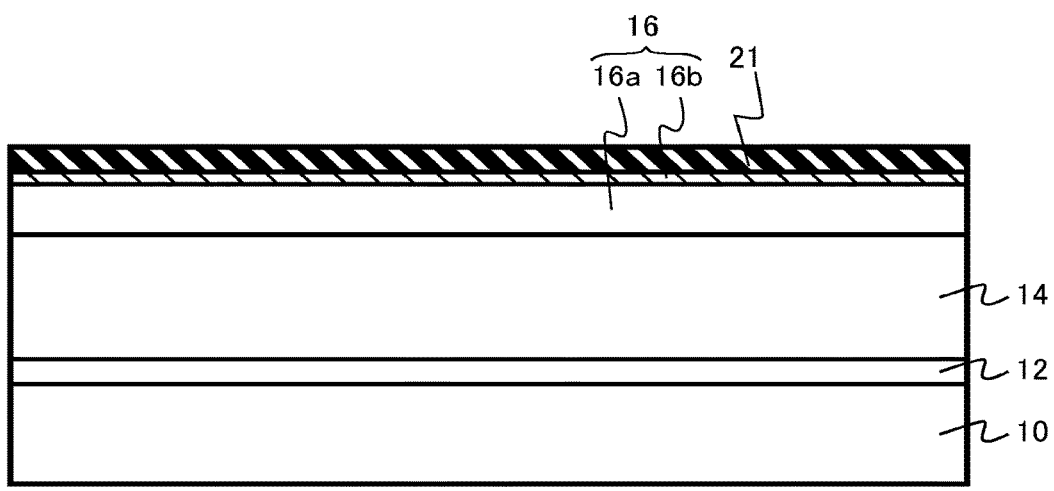
FIG. 12 is a cross-sectional view schematically illustrating the semiconductor device according to the second embodiment which is being manufactured.

The high-resistance region 16b is formed in a portion of the barrier layer 16 which is close to the insulating layer 21 by the heat treatment (FIG. 12). A portion of the barrier layer 16 below the high-resistance region 16b becomes the low-resistance region 16a having a lower electric resistivity than the high-resistance region 16b.

Two oxygen atoms are introduced to the lattice position of a nitrogen atom in the barrier layer 16 to form the high-resistance region 16b. For example, two oxygen atoms are introduced to a nitrogen defect of the barrier layer 16. For example, gallium or aluminum in the barrier layer 16 is diffused into the insulating layer 21.

Figure 13:
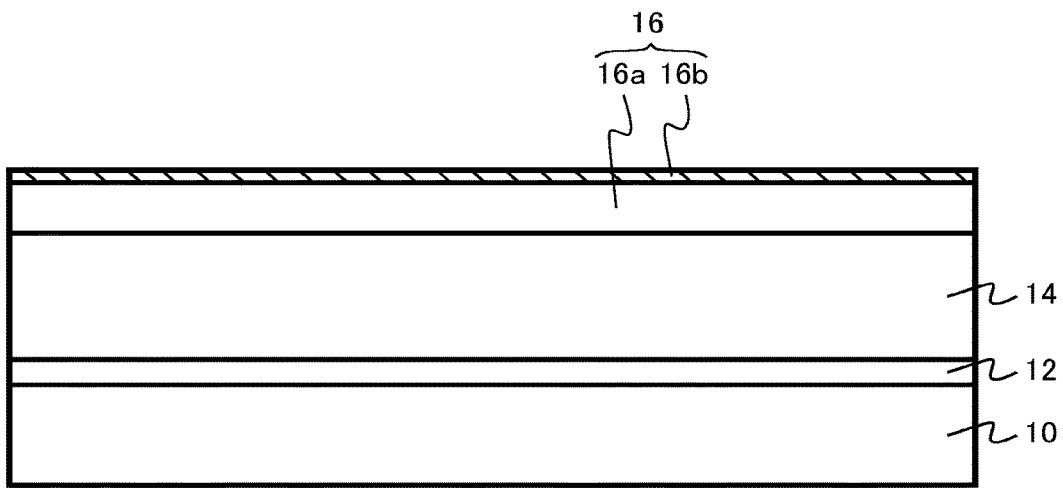
FIG. 13 is a cross-sectional view schematically illustrating the semiconductor device according to the second embodiment which is being manufactured.

Then, the insulating layer 21 is removed by wet etching (FIG. 13). The insulating layer 21 is removed under the condition that the high-resistance region 16b remains.

Figure 14:
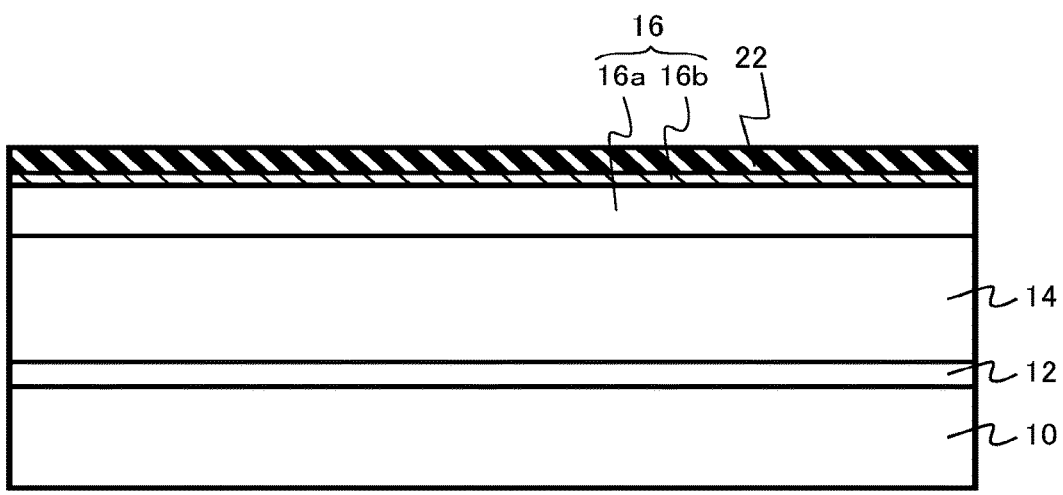
FIG. 14 is a cross-sectional view schematically illustrating the semiconductor device according to the second embodiment which is being manufactured.

Then, an insulating layer (second insulating layer) 22 is formed on the high-resistance region 16b (FIG. 14). The insulating layer 22 is, for example, a silicon oxide layer formed by the CVD method.

Then, the p-type layer 24 and the gate electrode 28 are formed on the insulating layer 22. Then, the source electrode 18 and the drain electrode 20 are formed on the barrier layer 16.

The HEMT 100 illustrated in FIG. 1 is formed by the above-mentioned manufacturing method.

According to the semiconductor device manufacturing method of this embodiment, the insulating layer 21 is removed to remove the impurities implanted into the insulating layer 21 when the high-resistance region 16b is formed. The impurities are, for example, gallium and aluminum. The impurities, such as gallium or aluminum, cause a level to be formed in the insulating layer such that electrons are trapped, which may cause a variation in the characteristics of a device.

According to the semiconductor device manufacturing method of this embodiment, the level in the bandgap is reduced to prevent current collapse. In addition, the level in the bandgap is reduced to prevent a variation in the threshold voltage. It is possible to remove impurities, such as gallium or aluminum, from the insulating layer and to prevent a variation in the characteristics of a device. Therefore, it is possible to achieve a semiconductor device with high reliability.

Third Embodiment

A semiconductor device according to this embodiment is the same as the semiconductor device according to the first embodiment except that the p-type layer comes into contact with the nitride semiconductor layer. Therefore, the description of the same content as that in the first embodiment will not be repeated.

Figure 15:
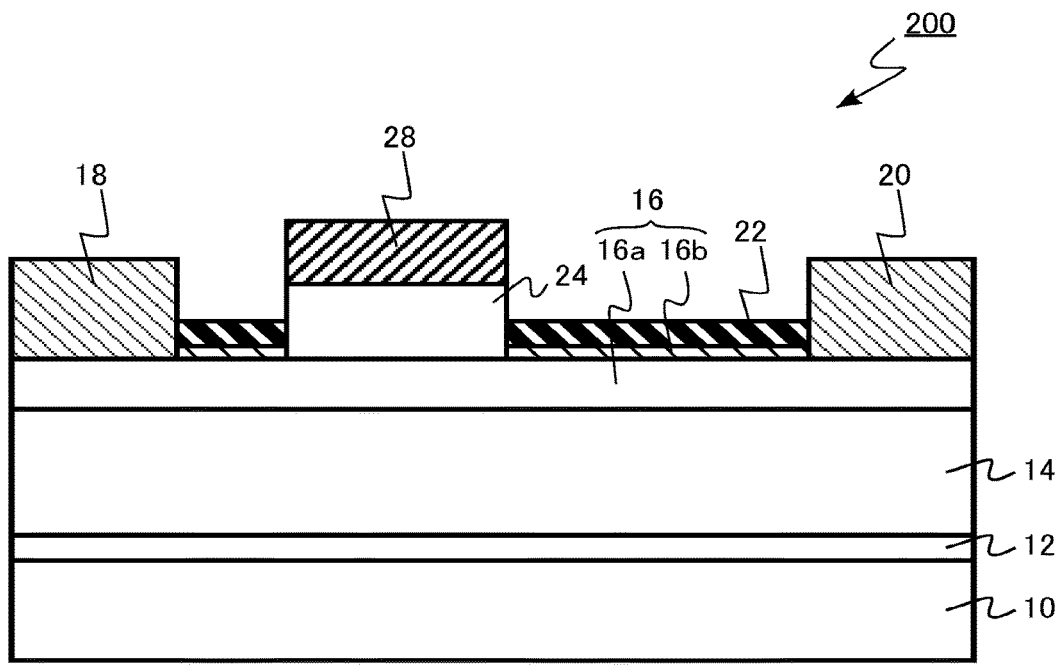
FIG. 15 is a cross-sectional view schematically illustrating a semiconductor device according to a third embodiment.

FIG. 15 is a cross-sectional view schematically illustrating the semiconductor device according to this embodiment. The semiconductor device according to this embodiment is an HEMT using a GaN-based semiconductor.

In an HEMT (semiconductor device) 200, a p-type layer 24 is provided so as to come into contact with the barrier layer 16. The p-type layer 24 comes into contact with the low-resistance region 16a. The p-type layer 24 is, for example, a single-crystal gallium nitride (GaN) layer.

According to the semiconductor device of this embodiment, a level in the bandgap is reduced to prevent current collapse. In addition, the level in the bandgap is reduced to prevent a variation in the threshold voltage. Therefore, it is possible to achieve a semiconductor device with high reliability. In addition, since the semiconductor device does not include a gate insulating layer, a variation in the threshold voltage is less likely to occur.

Fourth Embodiment

A semiconductor device according to this embodiment is the same as the semiconductor device according to the first embodiment except that the gate electrode comes into contact with the nitride semiconductor layer. Therefore, the description of the same content as that in the first embodiment will not be repeated.

Figure 16:
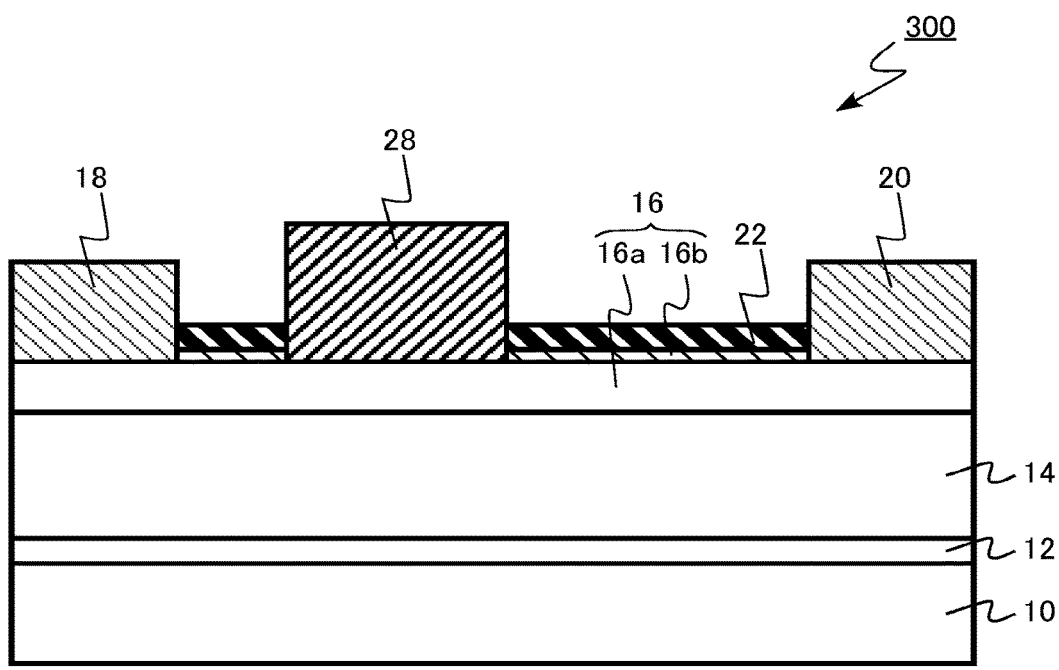
FIG. 16 is a cross-sectional view schematically illustrating a semiconductor device according to a fourth embodiment.

FIG. 16 is a cross-sectional view schematically illustrating the semiconductor device according to this embodiment. The semiconductor device according to this embodiment is an HEMT using a GaN-based semiconductor.

In an HEMT (semiconductor device) 300, a gate electrode 28 is provided so as to come into contact with the barrier layer 16. The gate electrode 28 comes into contact with the low-resistance region 16a.

The gate electrode 28 is, for example, a metal electrode. The gate electrode 28 is made of, for example, titanium nitride (TiN).

The junction between the gate electrode 28 and the barrier layer 16 is a Schottky junction. The HEMT 300 is a normally-on transistor.

According to the semiconductor device of this embodiment, a level in the bandgap is reduced to prevent current collapse. In addition, the level in the bandgap is reduced to prevent a variation in the threshold voltage. Therefore, it is possible to achieve a semiconductor device with high reliability. In addition, since the semiconductor device does not include a gate insulating layer, a variation in the threshold voltage is less likely to occur. Since the semiconductor device has a simple structure, it is easy to manufacture the semiconductor device.

Fifth Embodiment

A semiconductor device according to this embodiment is the same as the semiconductor device according to the first embodiment except that it has a so-called gate recess structure in which a gate electrode is buried in a recess formed in a barrier layer. Therefore, the description of the same content as that in the first embodiment will not be repeated.

Figure 17:
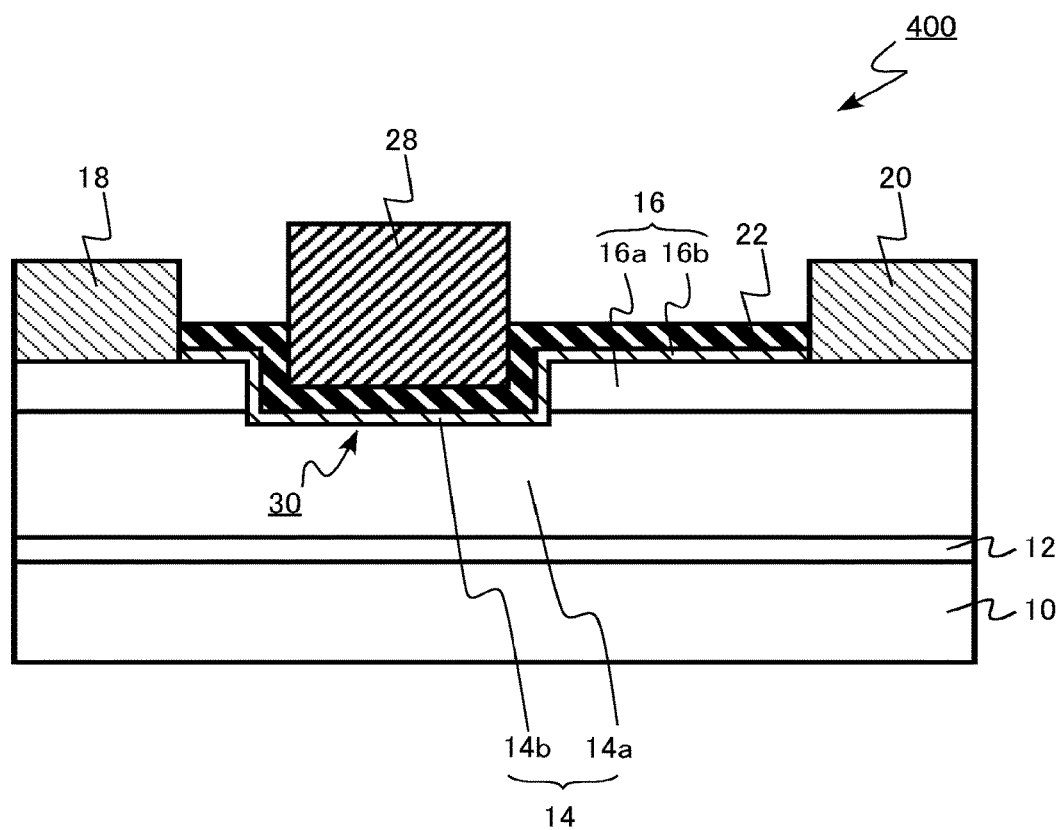
FIG. 17 is a cross-sectional view schematically illustrating a semiconductor device according to a fifth embodiment.

FIG. 17 is a cross-sectional view schematically illustrating the semiconductor device according to this embodiment.

In an HEMT (semiconductor device) 400, a high-resistance region 14b, the high-resistance region 16b, and the insulating layer 22 are formed on the inner surface of a recess 30 that is provided in the barrier layer 16 between the source electrode 18 and the drain electrode 20.

The bottom of the recess 30 is located in the channel layer 14. The high-resistance region 14b provided at the bottom of the recess 30 is formed in the channel layer 14. The low-resistance region 14a and the high-resistance region 14b form the channel layer 14.

According to the semiconductor device of this embodiment, a level in the bandgap is reduced to prevent current collapse. In addition, the level in the bandgap is reduced to prevent a variation in the threshold voltage. Therefore, it is possible to achieve a semiconductor device with high reliability. In addition, since the semiconductor device has the gate recess structure, it is easy to achieve a normally-off transistor.

Sixth Embodiment

A semiconductor device according to this embodiment differs from the semiconductor device according to the fifth embodiment in that the barrier layer is provided below the recess. Hereinafter, the description of the same content as that in the fifth embodiment will not be repeated.

Figure 18:
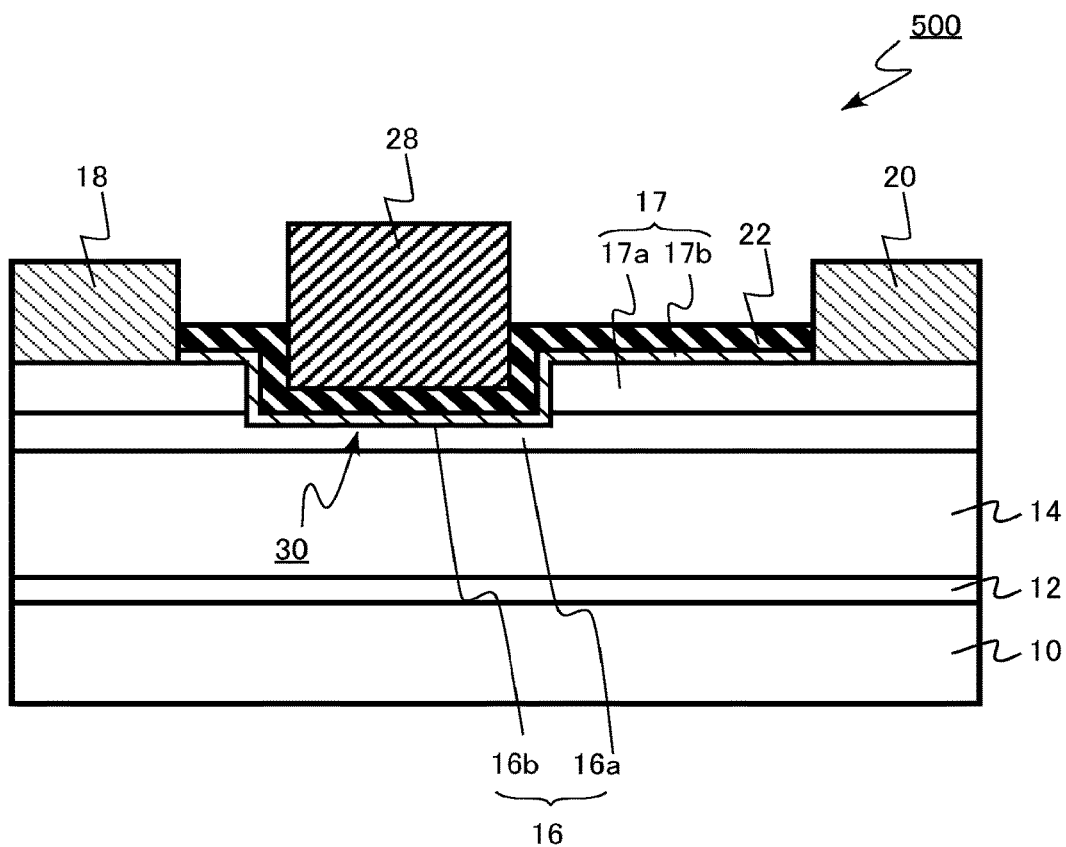
FIG. 18 is a cross-sectional view schematically illustrating a semiconductor device according to a sixth embodiment.

FIG. 18 is a cross-sectional view schematically illustrating the semiconductor device according to this embodiment.

In an HEMT (semiconductor device) 500, the barrier layer 16 is provided at the bottom of the recess 30. The barrier layer 16 is provided on the channel layer 14. A protective layer 17 made of nitride semiconductor is provided on both sides of the recess 30. The protective layer 17 is formed on the barrier layer 16 by, for example, selective epitaxial growth.

The channel layer 14 is made of, for example, GaN. The barrier layer 16 is, for example, an $Al_{0.1}Ga_{0.9}N$ layer with a thickness of 10 nm. The protective layer 17 is, for example, an $Al_{0.2}Ga_{0.8}N$ layer with a thickness of 20 nm.

In the HEMT 500, the high-resistance region 16b and the insulating layer 22 are formed on the inner surface of the recess 30. The low-resistance region 16a and the high-resistance region 16b form the barrier layer 16.

The insulating layer 22 is also formed between the source electrode 18 and the drain electrode 20. In addition, a low-resistance region 17a and a high-resistance region 17b are provided between the barrier layer 16 and the insulating layer 22.

The HEMT 500 is a normally-off transistor. A back barrier layer (not illustrated) which is made of a GaN-based semiconductor and has a wider bandgap than the channel layer 14 may be provided in at least a portion between the buffer layer 12 and the channel layer 14 in order to increase the threshold voltage of the HEMT 500. The back barrier layer is made of, for example, $Al_{0.1}Ga_{0.9}N$. The back barrier layer may be doped with, for example, Mg such that it is a p type.

In addition, a p-type layer (not illustrated) made of a p-type GaN-based semiconductor may be provided at the bottom of the recess 30 in order to increase the threshold voltage of the HEMT 500. The p-type layer is made of, for example, p-type GaN.

According to the semiconductor device of this embodiment, similarly to the first embodiment, a level in the bandgap is reduced to prevent current collapse. In addition, the level in the bandgap is reduced to prevent a variation in the threshold voltage. Therefore, it is possible to achieve a semiconductor device with high reliability.

Seventh Embodiment

A power circuit and a computer according to this embodiment include an HEMT.

Figure 19:
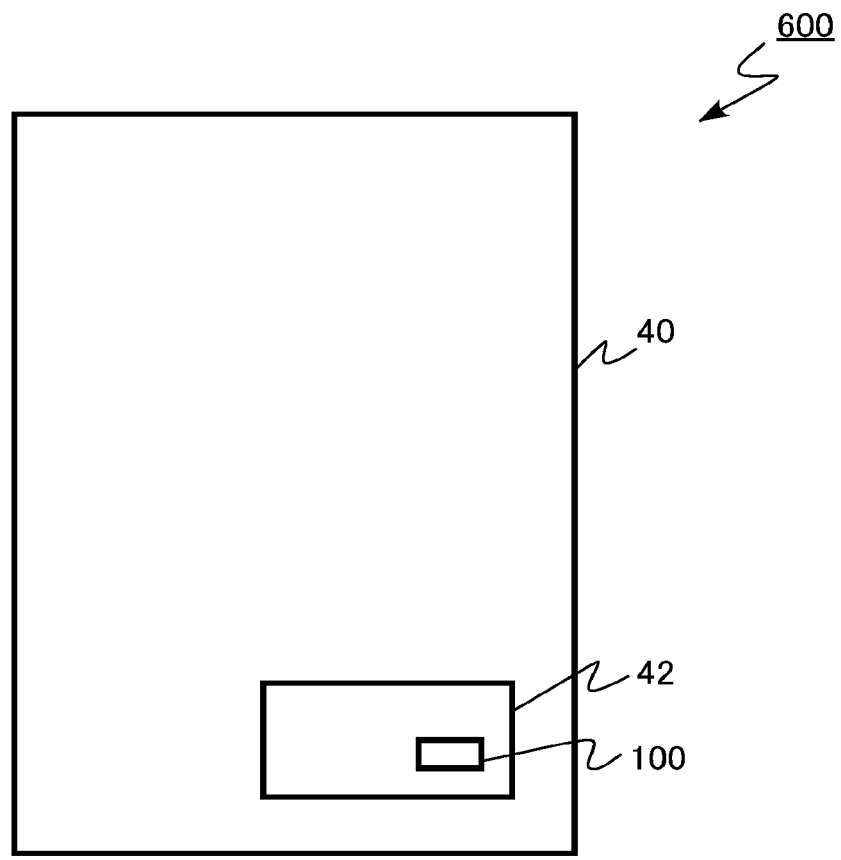
FIG. 19 is a diagram schematically illustrating a computer according to a seventh embodiment.

FIG. 19 is a diagram schematically illustrating the computer according to this embodiment. The computer according to this embodiment is a server 600.

The server 600 includes a power circuit 42 provided in a housing 40. The server 600 is a computer that executes server software.

The power circuit 42 includes the HEMT 100 according to the first embodiment. Instead of the HEMT 100, the HEMT 200, the HEMT 300, the HEMT 400, and the HEMT 500 according to the third to sixth embodiments may be applied.

Since the power circuit 42 includes the HEMT 100 in which current collapse is prevented, it has high reliability. Since the server 600 includes the power circuit 42, it has high reliability.

According to this embodiment, it is possible to achieve a power circuit and a computer with high reliability.

In the above-described embodiments, GaN or AlGaN is given as an example of the material forming the GaN-based semiconductor layer. However, for example, InGaN, InAlN, and InAlGaN including indium (In) may be applied. In addition, AlN may be applied as the material forming the GaN-based semiconductor layer.

In the above-described embodiments, the invention is applied to the HEMT. However, the invention is not limited to the HEMT and may be applied to other devices such as transistors or diodes.

While certain embodiments have been described, these embodiments have been presented by way of example only, and are not intended to limit the scope of the inventions. Indeed, the semiconductor device, the power circuit, the computer, and the semiconductor device manufacturing method described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a nitride semiconductor layer;
   an insulating layer provided on the nitride semiconductor layer;
   a first region provided in the nitride semiconductor layer; and
   a second region provided between the first region and the insulating layer in the nitride semiconductor layer, the second region having a higher electric resistivity than the first region, an oxygen concentration of the second region being equal to or greater than $2 \times 10^{19}$ cm$^{-3}$.

2. The semiconductor device according to claim 1,
   wherein the nitride semiconductor layer comprises a first semiconductor region and a second semiconductor region having a wider bandgap than the first semiconductor region, and
   the first region and the second region are provided in the second semiconductor region.

3. The semiconductor device according to claim 2,
   wherein the first semiconductor region is made of gallium nitride and the second semiconductor region is made of aluminum gallium nitride.

4. The semiconductor device according to claim 1,
   wherein two oxygen atoms are present in a lattice position of a nitrogen defect in the second region.

5. A semiconductor device comprising:
   a nitride semiconductor layer;
   an insulating layer provided on the nitride semiconductor layer;
   a first region provided in the nitride semiconductor layer; and
   a second region provided between the first region and the insulating layer in the nitride semiconductor layer, the second region having a higher electric resistivity than the first region,
   wherein the insulating layer comprises silicon oxide.

6. The semiconductor device according to claim 1,
   wherein the nitride semiconductor layer comprises gallium (Ga).

7. A semiconductor device comprising:
   a nitride semiconductor layer;
   an insulating layer provided on the nitride semiconductor layer;
   a first region provided in the nitride semiconductor layer; and
   a second region provided between the first region and the insulating layer in the nitride semiconductor layer, the second region having a higher electric resistivity than the first region;
   a first electrode being in contact with the nitride semiconductor layer;
   a second electrode being in contact with the nitride semiconductor layer; and
   a gate electrode provided between the first electrode and the second electrode, the insulating layer being interposed between the gate electrode and the nitride semiconductor layer.

8. A semiconductor device comprising:
a nitride semiconductor layer;
an insulating layer provided on the nitride semiconductor layer; and
a region provided in a portion of the nitride semiconductor layer close to the insulating layer, the region having two oxygen atoms present in a lattice position of a nitrogen defect.

9. The semiconductor device according to claim 8, wherein, at least one atom selected from the group consisting of a gallium (Ga) atom, an aluminum (Al) atom, and an indium (In) atom is present in the region, the at least one atom has a bond to an oxygen atom and a dangling bond.

10. The semiconductor device according to claim 8, wherein, at least one atom selected from the group consisting of a gallium (Ga) atom, an aluminum (Al) atom, and an indium (In) atom is present in the region, the at least one has two bonds, and each of the two bonds are bonded to an oxygen atom.

11. The semiconductor device according to claim 9, wherein the oxygen atom bonded to the at east one atom is one of the two oxygen atoms.

12. The semiconductor device according to claim 9, wherein the at least one atom is a gallium (Ga) atom or an aluminum (Al) atom.

13. The semiconductor device according to claim 8, wherein a silicon (Si) atom, a germanium (Ge) atom, a titanium (Ti) atom, a zirconium (Zr) atom, a hafnium (Hf) atom, or an iron (Fe) atom is bonded to one of the two oxygen atoms.

14. A power circuit comprising:
the semiconductor device according to claim 1.

15. A computer comprising:
the semiconductor device according to claim 1.

16. A method for manufacturing a semiconductor device, comprising:
forming a first insulating layer on a nitride semiconductor layer;
performing a heat treatment in an atmosphere comprising oxygen under a condition that an amount of oxidation of the nitride semiconductor layer is equal to or less than 1 nm; and
forming a region including oxygen in the nitride semiconductor layer,
wherein a temperature of the heat treatment is equal to or greater than 400° C. and equal to or less than 1050° C.

17. The method for manufacturing a semiconductor device according to claim 16,
wherein, after the performing the heal treatment, the first insulating layer is removed, and
a second insulating layer is formed on the nitride semiconductor layer.

18. The method for manufacturing a semiconductor device according to claim 16,
wherein two oxygen atoms are introduced to a lattice position of a nitrogen defect in the nitride semiconductor layer by the heat treatment.

19. The method for manufacturing a semiconductor device according to claim 16,
wherein oxygen molecules are comprised in the atmosphere.

20. The semiconductor device according to claim 5,
wherein two oxygen atoms are present in a lattice position of a nitrogen defect in the second region.

21. The semiconductor device according to claim 7,
wherein two oxygen atoms are present in a lattice position of a nitrogen defect in the second region.

* * * * *